United States Patent
Jai et al.

(10) Patent No.: US 8,994,911 B2
(45) Date of Patent: Mar. 31, 2015

(54) OPTICAL MEMORY DEVICE BASED ON DHFLC MATERIAL AND METHOD OF PREPARING THE SAME

(75) Inventors: Prakash Jai, New Delhi (IN); Ajay Kumar, New Delhi (IN); Amit Choudhary, New Delhi (IN); Anu Malik, New Delhi (IN); Indrani Coondoo, New Delhi (IN); Ashok Manikrao Biradar, New Delhi (IN)

(73) Assignee: Council of Scientific & Industrial Research, New Delhi (IN)

(*) Notice: Subject to any disclaimer, the term of this patent is extended or adjusted under 35 U.S.C. 154(b) by 614 days.

(21) Appl. No.: 13/260,509

(22) PCT Filed: Mar. 26, 2010

(86) PCT No.: PCT/IB2010/000683
§ 371 (c)(1),
(2), (4) Date: Feb. 20, 2012

(87) PCT Pub. No.: WO2010/109316
PCT Pub. Date: Sep. 30, 2010

(65) Prior Publication Data
US 2012/0140127 A1    Jun. 7, 2012

(30) Foreign Application Priority Data
Mar. 27, 2009 (IN) .............................. 625/DEL/2009

(51) Int. Cl.
C09K 19/02  (2006.01)
G11C 11/22  (2006.01)

(52) U.S. Cl.
CPC ............ *G11C 11/22* (2013.01); *C09K 19/0225* (2013.01)
USPC .......................................... 349/172; 349/185

(58) Field of Classification Search
USPC .................................. 349/182–186, 193, 172
See application file for complete search history.

(56) References Cited

U.S. PATENT DOCUMENTS 5,316,806 A     5/1994  Yoshinaga et al.
5,539,555 A *   7/1996  Wand et al. .................... 349/171
6,407,797 B1 *  6/2002  Biradar et al. ................. 349/187

OTHER PUBLICATIONS

Kumar et al., Dielectric and electro-optical studies of glycerol/ferroelectric liquid crystal mixture at room temperature. Jun. 2009. Journal of Applied Physics 105, 124101 (2009).*

*Primary Examiner* — Dung Nguyen
(74) *Attorney, Agent, or Firm* — Tarolli, Sundheim, Covell & Tummino LLP

(57) ABSTRACT

The invention relates to an optical memory device and method for the preparation of the optical memory device based on glycerol, a very common and versatile solvent, mixed deformed helix ferroelectric liquid crystal (DHFLC) having applications in ferroelectric liquid crystal based devices, the said method comprising the steps of forming patterns of different shapes and configurations by lithographic methods to obtain an effective electrode area of at least 4.5 mm on a glass substrate coated with indium tin oxide; depositing the patterned glass substrate with a polymer nylon 6/6 in the thickness range of 200 Å-400 Å; baking the coated substrate followed by hard rubbing of the polymer coated surface using buffing machine; photo lithographically developing spacer to maintain a uniform thickness of 3¼ m; filling glycerol mixed deformed ferroelectric liquid crystal material in the space between the coated glass substrates, followed by sealing the sandwiched glass substrates at the periphery; heating and cooling the sandwiched glass substrates, followed by application of electric field across the sandwiched substrates for achieving the stable memory action and fastness of the response, by applying an AC and DC field across the device to obtain an optical memory device.

18 Claims, 4 Drawing Sheets

OPTICAL MEMORY DEVICE BASED ON DHFLC MATERIAL AND METHOD OF PREPARING THE SAME

FIELD OF THE INVENTION

The present invention relates to an optical memory device and method for the preparation of the optical memory device. More particularly present invention based on deformed helix ferroelectric liquid crystal material mixed with solvent glycerol to be consequently used for manufacturing memory devices. The present invention relates to provide faster and long duration memory device having applications in electro-optical devices.

BACKGROUND OF THE INVENTION

Ferroelectric liquid crystals are generally known as being liquid crystals that exhibit smectic phases. These liquid crystals are used in image-producing displays by utilizing the properties that it possesses spontaneous polarization and that the direction of the spontaneous polarization changes under the influence of an external electric field.

It is reported by N. A. Clark, and S. T. Lagerwall, Appl. Phys Lett, Vol. 36, 899 (1980), that liquid crystal electro-optical devices using ferroelectric liquid crystals have memory characteristics and are capable of fast response. Ferroelectric liquid crystals (FLCs) are widely used in spatial light modulators, light shutters, optical inter-connects, optical switches, optical gates for optical computing, high definition television terminals, electro-optic modulators, display devices etc. Among all parameters of FLCs, the memory effect or the bistability is of primary concern because of its applications in personal computers, personal digital assistant, digital cameras etc. and having tremendous potentiality for low cost, large area, high speed, and high density memory needed for future computers. The fast switching bistable electro-optic devices based on FLC material comprises a well aligned thin (1-3 µm) layer of FLC sandwiched between two optically flat polished glass plates having transparent electrically conducting electrode patterns thereon. The two glass plates are peripherically sealed and the electrical connections are taken out from the substrates. The display fixed with crossed polarizers on outer faces of both glass plates is connected with very large scale integrated (VLSI) electronic modules to be used as an information display for displaying electrical or optical data.

At present, memory devices are based on:
1. Materials other than liquid crystals e.g. solid ferroelectrics, polymer etc.
2. Ferroelectric liquid crystal in surface stabilized geometry
3. Liquid crystal composite
4. cholesteric liquid crystal polymer
5. Organic ferroelectric layer and
6. Polymer dispersed liquid crystals

PRIOR ART

The use of surface stabilized ferroelectric liquid crystal (SSFLC) is well known in the prior art for bistable memory devices which are prepared by using two glass plates that are sheared at a temperature just below the Sm A-Sm C* phase transition keeping the cell thickness less than the pitch value of the material. Moreover, smectic layers get aligned by applying shear and that layer structure is retained in Sm C* phase of liquid crystal to get an uniform defect free alignment of ferroelectric liquid crystals, reference may be made to N. A. Clark & S. T. Lagerwall, U.S. Pat. No. 4,563,059; N. A. Clark, and S. T. Lagerwall, Appl. Phys Lett, Vol. 36, 899 (1980). The drawbacks of the memory devices based on above principle are stability and a uniform alignment over a large area because of the difficulty in applying uniform shear and to maintain a uniform temperature through out the SSFLC display. The technique thus cannot be used as a commercially viable one. It is also known in the state of art that the deformed helix ferroelectric liquid crystals (DHFLC) can also be used as memory devices. Reference may be made to S. Kishio, M. Ozaki, K. Yoshino, T. Sakurai, N. Mikami and R. Higuchi, as described in Jpn. J. Appl. Phys. Vol. 26, 513 (1987). The shortcomings of the DHFLC based memory devices are the transient nature of memory i.e. it is not permanent.

Another process of making storage devices was given by S Yamazaki, U.S. Pat. No. 4,954,985 wherein he invented a card with a display function having a data storage capability comprising a pair of substrates; a plurality of electrodes on the substrates; a liquid crystal orientation control film on the electrodes; and a liquid crystal material with a strong dielectric property filled between the pair of substrates; S. Yamazaki invented a liquid crystal memory device consisting an organic ferroelectric layer as described in U.S. Pat. No. 5,267,224. He showed an improved liquid crystal device such as an optical disc memory or a display device with a ferroelectric liquid crystal (FLC). FLC, a chiral smectic liquid crystal, is employed to exhibit a hysteresis between a pair of substrates which have easy polarization axes normal to each other. Information to be recorded is written on the disc in terms of a binary system by use of the hysteresis.

Reference may be made to S. M. Faris who invented optical mass storage system and memory cell as described in U.S. Pat. No. 5,353,247. His invention relates to a new read-write optical storage technology which is based on the cholesteric liquid crystal (CLC) polymer property of selective reflection at a characteristic wavelength. Another known useful device in the state of the art is non-volatile memory device and a method for producing the same as described by T. Kawamura, N. Kimura, Y. Yamamoto, and Y. Ishii, in U.S. Pat. No. 5,579,199. Their invention includes: a substrate; a storage medium provided above the substrate; a writing unit having a heating unit provided above the substrate, for heating the storage medium by the heating unit to write data in the storage medium with a thermal change of a physical value of the storage medium; and a reading unit having an electrical reading unit provided above the substrate, for reading the change of the physical value of the storage medium as data written in the storage medium by the electrical reading unit.

Reference may be made to another known useful study in the state of the art is to get bistability in DHFLC as described by S. Kaur et al.; in J. Appl. Phys., Vol. 96, 2547 (2004). Few other studies can be used to prepare the bistable devices as described by Thakur et al., in Appl. Opt. Vol. 43, 5614 (2004) and Kaur et al. in Physica B, Vol. 352, 337 (2004). However, the condition for having stable memory effect in DHFLC has been described by J. Prakash et al. in J. Appl. Phys. 103, 044103 (2008). Another known process in the state of the art is to dope gold nanoparticles (GNPs) in DHFLC to have complete memory effect as described by J. Prakash et al; Appl. Phys. Lett., Vol. 93, 112904 (2008). But the GNPs are costlier and difficult to disperse in LC, and so, the repeatability is poor in such cells.

As far as the improvement in the response of the liquid crystal is concerned, various groups have mixed carbon nanotubes in different types of liquid crystals. Lee et al.; Appl.

Phys. Lett., Vol. 85, 513 (2004) demonstrated the effect of CNTs on LC to improve the switching behavior. Faster electro-optical response characteristics of cabon-nanotubes-nematic suspension have been studied as described by Chen et al. in Appl. Phys. Lett. Vol. 90, 033510 (2007). The CNTs doped LC optically compensated birefringent cells was studied for improvement in response time where the change in anchoring energy was taken into account. The reference may be made to Lu et al.; Opt. Exp. Vol. 16, 12777 (2008). But CNTs are very difficult to synthesize and very difficult to disperse homogeneously in liquid crystal material.

OBJECTS OF THE INVENTION

The main object of the present invention is to provide a long duration optical memory device based on glycerol mixed deformed helix ferroelectric liquid crystal material having applications in ferroelectric liquid crystal based devices, which obviate the drawbacks of hitherto known memory devices based on other types of liquid crystal materials.

Yet another object of the present invention is to provide a method for the preparation of a long duration optical memory device.

Yet another object of the present invention is to provide an optical memory device having faster response.

Yet another object of the present invention is to provide a process for preparing an optical memory device using the homogeneous alignment of liquid crystal materials.

Yet another object of the present invention is to provide a process for preparing a memory device by deposition of polymer coating on glass substrates.

SUMMARY OF THE INVENTION

Accordingly, the present invention provides an optical memory device comprising: a sealed cell structure (10) defining a space (12), said cell structure (10) comprising a pair of transparent substrates (14, 16) having electrodes (18, 10) formed thereupon;

In one embodiment, the electrodes are made of transparent conducting material selected from the group consisting of indium tin oxide, tin oxide, and zinc oxide.

In another embodiment, the transparent substrates are held at a predetermined distance from each other using spacer which is formed on a surface of at least one of the transparent substrate that faces the other substrate.

In yet another embodiment, the thickness of the spacer is in the range of 1 to 5 μm.

In still another embodiment, the spacer is made of a film of photoresist prepared by photolithographic technique.

Accordingly, the present invention relates to a method of preparing an optical memory device comprising the steps of forming a cell structure comprising a pair of transparent substrates having electrodes deposited thereupon with a space defined between the transparent substrates; filling a mixture of deformed helix ferroelectric liquid crystal (DHFLC) and glycerol in the defined space, the glycerol being in the volume ratio of 3.3-10% of DHFLC; and sealing and baking the cell structure to obtain the optical memory device.

In one embodiment, the transparent substrates are glass substrates.

In another embodiment, the cell structure is formed by the steps of cleaning and drying a pair of optically flat glass substrates; heating the dried glass substrates to a temperature in the range of 100°-250° C. for a period in the range of 30 min. to 60 min. in a vacuum chamber; and coating the heated glass substrates by depositing a thin film of indium tin oxide (ITO) having a thickness in the range of 1000 Å to 2000 Å to obtain coated glass substrates with sheet resistance in the range of 30 to 500Ω/□ and optical transmission of at least 90%.

In yet another embodiment, upon obtaining the coated glass substrates, the method further comprises the steps of: cleaning thoroughly the said coated glass substrates in a detergent and acetone followed by rinsing in deionized water and drying in nitrogen gas and forming patterns to obtain an effective electrode area of at least 4.5 mm$^2$; cleaning again and drying the patterned glass substrates followed by spin coating of the patterned glass substrate with a polymer selected (nylon 6/6) in the thickness range of 200 to 400 Å; and baking the coated substrate at a temperature in the range of 100° C. to 120° C. for a period in the range of 30 min to 45 min followed by rubbing of the polymer coated surface in the desired direction of the surface of the coated glass substrate.

In another embodiment, the method further comprises coating one of the baked substrates with spin coating to get a spacer having thickness in the range of 1 to 5 μm; and assembling the coated glass substrates into a cell structure by maintaining a uniform cell gap and matching patterned ITO electrodes with small gap in the spacer photoresist deposited on one of the substrates.

In yet another embodiment, filling the mixture comprises filling the mixture in the space defined by the cell structure by capillary action done by heating at the temperature in the range of 80-100° C. followed by slow cooling at the rate of 5° C. per hour.

In still another embodiment, sealing of the cell structure is carried out by thermal setting a thermoplastic or UV sealant.

In another embodiment, baking the sealed cell structure comprises baking the cell structure at a temperature in the range of 40 to 60° C. for the time period in the range of 1 to 2 hours.

In yet another embodiment, the coating used is selected from the group consisting of indium tin oxide, tin oxide, and zinc oxide.

In still another embodiment, the solution for cleaning is selected from the group consisting of chromic acid, trichloroethylene, methanol.

In another embodiment, cleaning the patterned glass substrates comprises dipping the said substrates in silane solution.

In yet another embodiment, the spacer is made of a film of photoresist prepared by photolithographic technique.

DETAILED DESCRIPTION

Figure 1:
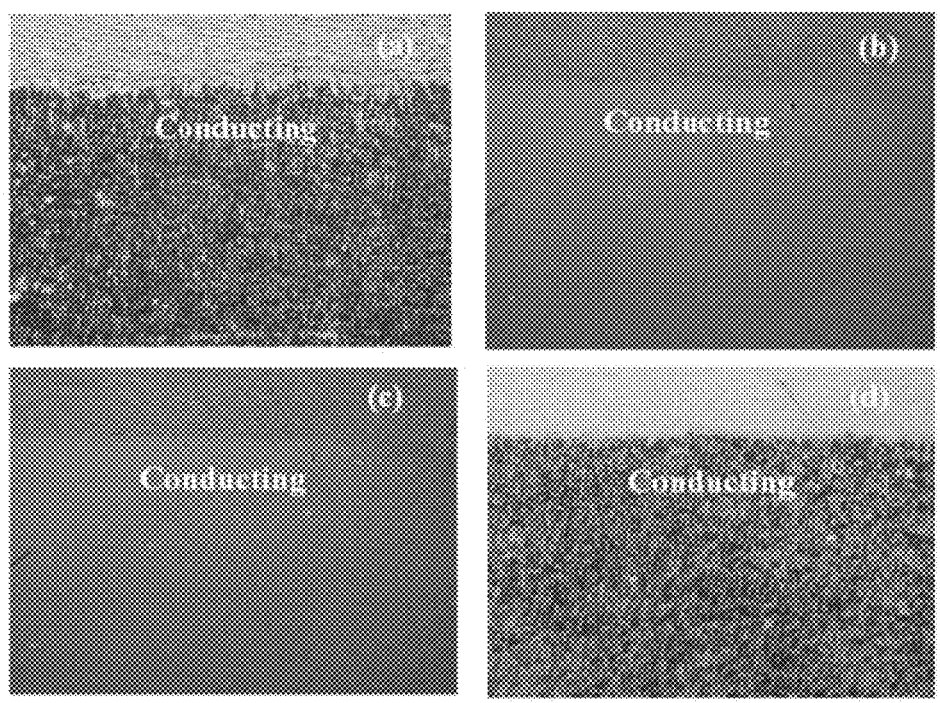
FIG. 1 indicates a systematic study of optical memory (a) scattered state i.e. without any application of external electric field (b) state on the application electric field of 8 V, (c) state after duration of 42 hours i.e. observance of optical memory effect, and (d) non memory state brought by the application of small amplitude, 1 V and 40 Hz sine wave electric signal.
Figure 2:
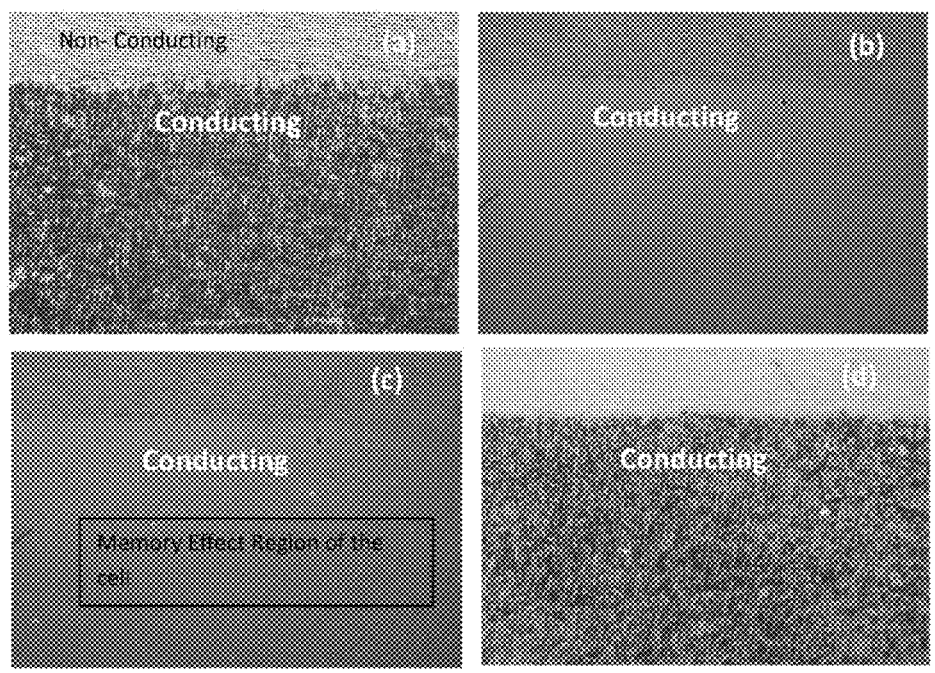
FIG. 2 is an electric signal of optical transmission obtained after the conversion through photodiode mounted on the optical microscope on the application of square delayed pulses by using amplitude modulation facility of the function generator (HP 33120A Arbitrary Waveform Generator) CH1:8.000 V/DIV shows driving square voltage and CH2:0.050 V/DIV shows its optical response, outside mark on y-axis (voltage axis) shows zero voltage level for respective channels. TBA: Shows the time scale per division on x-axis, which is same for both channels. (a) 1 Hz shows the complete stability of the transmission, (b) 200 Hz shows the start of degradation of memory transmission, and (c) 500 Hz shows the sharp degradation of memory at edges of the input signals i.e. the delay in response.
Figure 3:
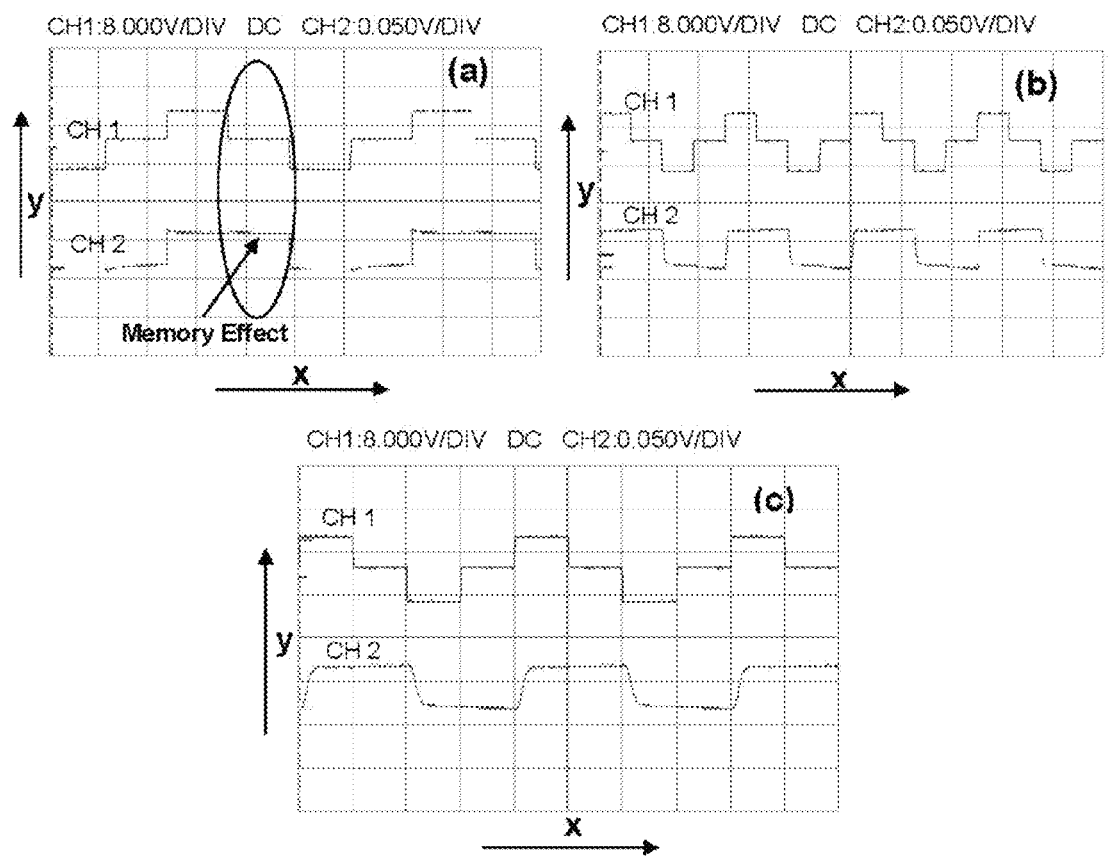
FIG. 3 is the behavior of response time with the applied voltage of pure and glycerol mixed DHFLC material respectively. The solid squares represent the response time of pure DHFLC material whereas the empty squares represent the same for glycerol mixed DHFLC material.
Figure 4:
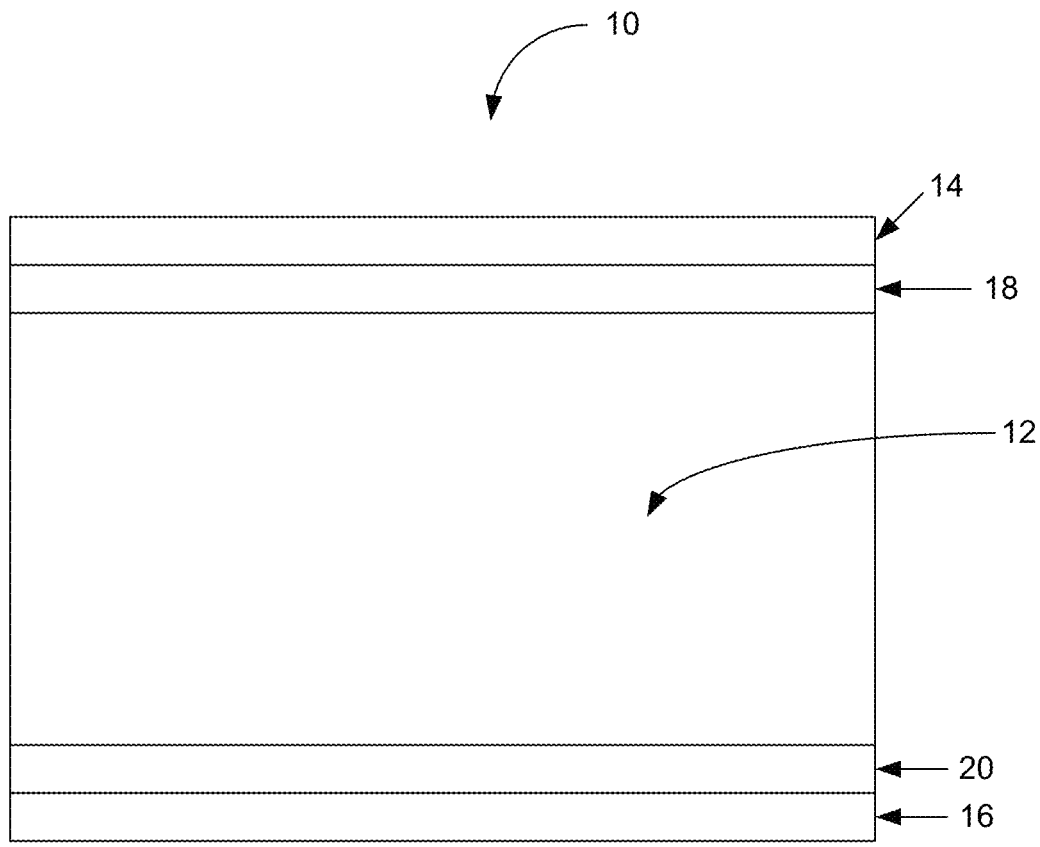
FIG. 4 shows a schematic view of the cell structure used as an optical memory device.

The novelty of the present invention for memory devices is that the glycerol mixed DHFLC material memory devices are the most stable (upto 90 hours) and have fast response (50% faster than the pure DHFLC material). The glass plates of required size are initially edge polished. Preferably the glass plates are borosilicate, fused silica, or of quartz. Glass plates are then roughly grounded by known techniques to desired thickness by emery powders and then finally polished to achieve optical flatness of at least $\lambda/4$-$\lambda/2$ per inch using cerium oxide. The glass plates are then cleaned to remove grease, dust etc. from their surfaces. Glass plates are initially boiled in chromic acid ($K_2Cr_2O_7+H_2SO_4+H_2O$) for 2-3 min and then cleaned in ultrasonic cleaner. Plates are then thoroughly cleaned successively in acetone, methanol and deionized water. Glass plates are then dried using filtered moisture free nitrogen gas. The glass plates are then coated with a transparent conducting material under vacuum to form a thin layer of transparent conducting indium tin oxide. Glass plates are initially heated to 250° C. in vacuum. Initial pressure attained in vacuum chamber is $10^{-6}$ torr. Oxygen is introduced in the chamber to attain a pressure of about $2\times10^{-5}$ torr. Indium oxide doped with about 3% metal tin is evaporated slowly by electron-beam gun to be deposited on hot glass plates. Oxygen in the chamber reacts with ongoing vapours to form a thin layer of indium tin oxide. The sheet resistance achieved in this case is in the range of 30 to 50Ω/□ with an optical transmission of more than 85% in the visible range. The coated glass plates are cleaned again sequentially in soap solution, acetone, and methanol and deionized water. The desired electrode pattern is formed by photolithographic and etching technique on the said glass plates. The glass substrates are spin coated initially with negative photoresist. Coated glass plates are prebaked at 80° C. for 10 minutes. Plates are then exposed to UV radiations for 1-4 minutes with the negative of electrode pattern on the photoresist. The portion in the pattern, which is to be retained, should be transparent to light. The exposed plates are then developed using dilute (1:3) Kodak photoresist developer for one minute. The glass substrates are then post-baked to harden the patterned photoresist. Plates are then etched to remove undesired ITO conducting film. Photoresist from the glass plates is then wiped off using acetone.

The glass substrates, having desired transparent conducting pattern are initially coated with an adhesion promoter, commercially available VM 651 (Dupont) or a silane solution treatment. For silane (0.5% solution of phenyl trichloro silane in toluene) treatment the glass substrates are dipped for 10 minutes and are rinsed in propanol. This procedure is immediately followed by deposition of the polyamide nylon solution. The nylon solution is prepared by taking a 1.0% (wt. to vol.) of nylon 6/6 and dissolved in 60% m-cresol and 40% methanol (vol. to vol.). A thin layer of this solution is applied to the glass substrates by spinning. In this case, the spinning ratio and the concentration determine the thickness of the polymer coating and therefore is very critical. First sufficient solution is kept on the glass substrate in order to cover the entire sample. The sample is then spun at 4000 RPM for not more than one minute. The excess solvent is allowed to evaporate by heating the glass substrates in an oven at a temperature not exceeding 130° C. or for a time period not more than one hour. Further, the polymer treated substrates are unidirectionally rubbed with a good quality velvet cloth. To achieve repeatability in the rubbed treatment, rubbing on the polymer coated glass substrate is done using a buffing machine. In this machine, one can control the rubbing pressure as well as the number of rubbing strokes. The distance between the rubbing block and the glass substrates is maintained by means of a head-screw. When the rubbing block just touches the glass substrates, it is termed as minimum rubbing and when head-screw completes one turn, it is taken as the maximum rubbing pressure. After the alignment layer treatment by rubbing, the next step is to assemble the two glass plates to form a cell. The most important thing in this process is to obtain uniform and accurate cell spacing. For this, on one of the glass substrates mylar spacers of known thicknesses are kept on the nonactive electrode area. The spacers are kept in such a way that there are two openings at the opposite sides to inject the liquid crystal material inside. Then the other glass plate is placed on to it so that the electrodes on them are properly matched to form an active display area. They are sealed together at the periphery, except the two openings, by Torr seal (Varian Associates, USA).

However, achieving very thin samples (thickness of the order of 1-3 μm) is very difficult by mylar spacers. Therefore, before the polymer treatment of the glass substrates, a thin layer of negative photoresist material is photo lithographically formed on one of the substrate to form the spacer. By controlling the thickness of the photoresist layer one can control the thickness of the cell prepared. The photoresist coated glass plates are then baked at 200-250° C. range for 30 minutes to harden the photoresist coating. After this, the normal polymer coating and rubbing procedures are carried out and the cells are sealed. The cell thickness is measured by capacitance measurements or using optical interference method. After the photoresist spacer and surface alignment coatings, the glass plates are assembled and sealed with a sealant. The glycerol in the range of 1-2 μl mixed with 2 to 3 mg of DHFLC material FLC 6304 (Rolic, Switzerland) (i.e. glycerol is mixed in the volume ratio range of 3.3-10% of DHFLC, maximum case) having a phase sequence of crystalline (−14° C.) smectic C*(60.5° C.) smectic A (64° C.) isotropic phase was then filled at its isotropic temperature in the gap between the two substrates by capillary action. For this the liquid crystal material is placed near the small opening between the spacer and is filled by heating the sample to its isotropic phase. After the material has crept completely inside the cell, it is cooled slowly to ferroelectric liquid crystalline (Sm C*) phase. The final sealing is then done with the sealant and baked to effect the completion of the device fabrication. Now the optical memory device is ready for testing and use. This is achieved by fixing crossed polarizer on the two faces of the device to observe the memory effect. The complete device is placed on the rotary table of an optical microscope and for observing static memory effect a DC field of 10 volts is applied to the sample and the sample is adjusted so as to get a dark i.e. no light transmission through the sample. Immediately the DC field is removed which enforces the sample to remain in the dark state for days, which is the memory state. For destroying the memory state or for getting the other state (bright) in memory, the polarity of the applied field is changed. The invented optical memory effect, based on glycerol mixed DHFLC can be used in information processing devices. One of the most important devices for optical processing is to fabricate random access memory (RAM) of the computer. It could be implemented in flexible processing. Such devices find lots of applications in space.

The process of the present invention is further illustrated by the following example which should not however be construed to limit the scope of present invention.

EXAMPLE 1

1.µl of glycerol is mixed with 2 mg of DHFLC material (FLC 6304, Rolic, Switzerland) (i.e glycerol is mixed with DHFLC in volume ratio of 0.5% of DHFLC) having a phase sequence of crystalline (−14° C.) smectic C* (60.5° C.) smectic A (64° C.) isotropic phase. The mixture is then filled at its isotropic temperature in the gap between the two substrates.

EXAMPLE 2

2 µl of glycerol is mixed with 3 mg of DHFLC material (LAHS 19, synthesis in Darmstadt, Germany) (i.e glycerol is mixed with DHFLC in the volume ratio of 6.6% of DHFLC) having the smectic C* phase at room temperature. The mixture is then filled at its isotropic temperature in the gap between the two substances.

EXAMPLE 3

1.µl of glycerol is mixed with 1 mg conventional DHFLC material (FLC 6304, Rolic, Switzerland) (i.e glycerol is mixed with DHFLC in the volume ratio of 10% of DHFLC) having a phase sequence of crystalline (−14° C.) smectic C* (60.5° C.) smectic A (64° C.) isotropic phase. The mixture is then filled at its isotropic temperature in the gap between the two substances.

EXAMPLE 4

1 µl of glycerol is mixed with 3 mg of conventional DHFLC material (FLC 6304, Rolic, Switzerland) (i.e glycerol is mixed with DHFLC in the volume ratio of 3.3% of DHFLC) having a phase sequence of crystalline (−18° C.) smectic C* (60.5° C.) smectic A (64° C.) isotropic phase. The mixture is then filled at its isotropic temperature in the gap between the two substances.

EXAMPLE 5

Borosilicate glass substrates of size 3 cm×2 cm are taken and roughly edge grounded by using emery powder to get smoothened edges. These ground glass plates were subsequently polished to get an optical flatness of λ/2 per inch by using cerium oxide powder. These polished glass plates are then cleaned thoroughly in $K_2Cr_2O_7$, $H_2SO_4$, trichloroethylene and methanol with ultrasonic agitation and subsequently rinsed in deionized water and finally dried by using dry nitrogen gas. These cleaned glass plates are heated to a temperature of 100° C. for 60 min and then coated with thin indium tin oxide (ITO) film by depositing a thin layer of indium oxide doped with 3% tin in a vacuum deposition chamber by electron beam deposition. This process gives a sheet resistance of 40Ω/□ and an optical transmission of 90%. These ITO coated glass substrates are again cleaned thoroughly in detergents and acetone and finally rinsed in deionized water and patterned by photolithography to get an effective electrode area of 4.5×4.5 mm². The glass substrates patterned with ITO are again cleaned and dried as mentioned above. The glass substrate was spin coated with nylon 6/6 polymer on the conducting patterned surface of the substrate. The nylon coated substrates were then baked at a temperature of 100° C. for 30 mins. The substrates after the nylon coating and hardening are rubbed by velvet cloth on the polymer surface. The rubbing is accomplished by buffing machine by affecting the rub for 20 times and is done along the plane of the substrate. After the rubbing is completed, a photoresist is spin coated on one of the substrates to get a spacer of 3 µm thickness. The two glass plates are then brought in contact and properly matched with regard to the patterned ITO electrodes. There is a small gap in the spacer photoresist deposited on one of the substrates. The sandwich structure is then sealed on the two opposite sides by a vacuum sealant Torr Seal of Varian Associates to complete the preparation of the making of the cell for use as an optical memory device. The 1 µl glycerol mixed with 2 mg of DHFLC material (FLC 6304, Rolic, Switzerland) (i.e. glycerol is mixed in volume ratio of 5% of DHFLC) having a phase sequence of crystalline (−14° C.) smectic C* (60.5° C.) smectic A (64° C.) isotropic phase was then filled at its isotropic temperature in the gap between the two substrates. The final sealing is then done with the sealant and baked to effect the completion of the device fabrication. Now the optical memory, device is ready for testing and use. This is achieved by fixing crossed polarizer on the two faces of the device and applying electric field (Vpp=20 V at 80 Hz frequency) for two hours at room temperature for aligning the FLC material in the plane of the polymer coated substrate for getting the memory effect. The complete device is placed on the rotary table of an optical microscope and the sample so adjusted so as to get a dark state i.e. no light transmission through the sample. Next a field of 8 V DC was applied for few sec. and immediately after removing the dc bias, the sample remains in the dark state for more than 24 hours.

EXAMPLE 6

Borosilicate glass substrates of size 3 cm×2 cm are taken and roughly edge grounded by using emery powder to get smoothened edges. These ground glass plates were subsequently polished to get an optical flatness of λ/2 per inch by using cerium oxide powder. These polished glass plates are then cleaned thoroughly in $K_2Cr_2O_7$, $H_2SO_4$, trichloroethylene and methanol with ultrasonic agitation and subsequently rinsed in deionized water and finally dried by using dry nitrogen gas. These cleaned glass plates are heated to a temperature of 150° C. for 60 min and then coated with thin Indium tin oxide film by depositing a thin layer of indium oxide (ITO) doped with 3% tin in a vacuum deposition chamber by electron beam deposition. This process gives a sheet resistance of 100Ω/□ and an optical transmission of 90%. These (ITO) coated glass substrates are again cleaned thoroughly in detergents and acetone and finally rinsed in deionized water and patterned by photolithography to get an effective electrode area of 4.5×4.5 mm². The glass substrates patterned with ITO are again cleaned and dried as mentioned above. The glass substrate was spin coated with nylon 6/6 polymer on the conducting patterned surface of the substrate. The nylon coated substrates were then baked at a temperature of 110° C. for 35 mins. The substrates after the nylon coating and hardening are rubbed by velvet cloth on the polymer surface. The rubbing is accomplished by buffing machine by affecting the rub for 20 times and is done along the plane of the substrate. After the rubbing is completed, a photoresist is spin coated on one of the substrates to get a spacer of 3 µm thickness. The two glass plates are then brought in contact and properly matched with regard to the patterned ITO electrodes. There is a small gap in the spacer photoresist deposited on one of the substrates. The sandwich structure is then sealed on the two opposite sides by a vacuum sealant Torr Seal of Varian Associates to complete the preparation of the making of the cell for use as an optical memory device. The 2 µl glycerol mixed with 3 mg of DHFLC material (LAHS 19, synthesis in Darmstadt, Germany) (i.e. glycerol is mixed in the volume ration of 6.6% of DHFLC) having the smectic C* phase at room temperature, was then filled at its isotropic temperature in the gap between the two substances. The final sealing is then done with the sealant and baked to effect the completion of the device fabrication. Then, a crossed polarizer on the two faces of the device (now the optical memory device) was fixed making it ready for testing and use. The complete device is placed on the rotary table of an optical microscope and the sample is so adjusted so as to get a dark state i.e. no light transmission through the sample. Next a field of 8 V DC was applied for 5, sec. and immediately after removing the DC bias, the sample remained in the dark state and found to be in the same state for at least two days.

EXAMPLE 7

Borosilicate glass substrates of size 3 cm×2 cm are taken and roughly edge grounded by using emery powder to get smoothened edges. These ground glass plates were subsequently polished to get an optical flatness of $\lambda/2$ per inch by using cerium oxide powder. These polished glass plates are then cleaned thoroughly in $K_2Cr_2O_7$, $H_2SO_4$, trichloroethylene and methanol with ultrasonic agitation and subsequently rinsed in deionized water and finally dried by using dry nitrogen gas. These cleaned glass plates are heated to a temperature of 250° C. for 30 min and then coated with thin Indium tin oxide film by depositing a thin layer of indium oxide (ITO) doped with 3% tin in a vacuum deposition chamber by electron beam deposition. This process gives a sheet resistance of 500Ω/☐ and an optical transmission of 94%. These (ITO) coated glass substrates are again cleaned thoroughly in detergents and acetone and finally rinsed in deionized water and patterned by photolithography to get an effective electrode area of 4.5×4.5 mm². The glass substrates patterned with ITO are again cleaned and dried as mentioned above. The glass substrate was spin coated with nylon 6/6 polymer on the conducting patterned surface of the substrate. The nylon coated substrates were then baked at a temperature of 120° C. for 45 mins. The substrates after the nylon coating and hardening are rubbed by velvet cloth on the polymer surface. The rubbing is accomplished by buffing machine by affecting the rub for 20 times and is done along the plane of the substrate. After the rubbing is completed, a photoresist is spin coated on one of the substrates to get a spacer of ~1 µm thickness. The two glass plates are then brought in contact and properly matched with regard to the patterned ITO electrodes. There is a small gap in the spacer photoresist deposited on one of the substrates. The sandwich structure is then sealed on the two opposite sides by a vacuum sealant Torr Seal of Varian Associates to complete the preparation of the making of the cell for use as an optical memory device. The 1 µl glycerol mixed with 1 mg conventional DHFLC material (FLC 6304, Rolic, Switzerland) (i.e. glycerol is mixed in the volume ratio of 10% of DHFLC, the maximum case) having a phase sequence of crystalline (−14° C.) smectic C* (60.5° C.) smectic A (64° C.) isotropic phase, was then filled at its isotropic temperature in the gap between the two substances. The final sealing is then done with the sealant and baked to effect the completion of the device fabrication. Now the optical memory device is ready for testing and use. This is achieved by fixing crossed polarizer on the two faces of the device and applying electric field (Vpp=20 V at 80 Hz frequency) for two hours at room temperature for aligning the FLC material in the plane of the polymer coated substrate for getting the memory effect. The complete device is placed on the rotary table of an optical microscope and the sample so adjusted so as to get a dark with a field of 8 V DC was applied for 5 sec. Immediately, after removing the DC bias the field of view remained in the dark state for more than 2 days.

EXAMPLE 8

Borosilicate glass substrates of size 3 cm×2 cm are taken and roughly edge grounded by using emery powder to get smoothened edges. These ground glass plates were subsequently polished to get an optical flatness of $\lambda/2$ per inch by using cerium oxide powder. These polished glass plates are then cleaned thoroughly in $K_2Cr_2O_7$, $H_2SO_4$, trichloroethylene and methanol with ultrasonic agitation and subsequently rinsed in deionized water and finally dried by using dry nitrogen gas. These cleaned glass plates are heated to a temperature of 250° C. for 30 min and then coated with thin Indium tin oxide film by depositing a thin layer of indium oxide (ITO) doped with 3% tin in a vacuum deposition chamber by electron beam deposition. This process gives a sheet resistance of 500Ω/☐ and an optical transmission of 94%. These (ITO) coated glass substrates are again cleaned thoroughly in, detergents and acetone and finally rinsed in deionized water and patterned by photolithography to get an effective electrode area of 4.5×4.5 mm². The glass substrates patterned with ITO are again cleaned and dried as mentioned above. The glass substrate was spin coated with nylon 6/6 polymer on the conducting patterned surface of the substrate. The nylon coated substrates were then baked at a temperature of 120° C. for 30 mins. The substrates after the nylon coating and hardening are rubbed by velvet cloth on the polymer surface. The rubbing is accomplished by buffing machine by affecting the rub for 20 times and is done along the plane of the substrate. After the rubbing is completed, a photoresist is spin coated on one of the substrates to get a spacer of ~5 µm thickness. The two glass plates are then brought in contact and properly matched with regard to the patterned ITO electrodes. There is a small gap in the spacer photoresist deposited on one of the substrates. The sandwich structure is then sealed on the two opposite sides by a vacuum sealant Torr Seal of Varian Associates to complete the preparation of the making of the cell for use as an optical memory device. The 1 µl glycerol mixed with 3 mg of conventional DHFLC material (FLC 6304, Rolic, Switzerland) (i.e. glycerol is mixed in the volume ratio of 3.3% of DHFLC, minimum case) having a phase sequence of crystalline (−14° C.) smectic C* (60.5° C.) smectic A (64° C.) isotropic phase, was then filled at its isotropic temperature in the gap between the two substances. The final sealing is then done with the sealant and baked to effect the completion of the device fabrication. Now the optical memory device is ready for testing and use. This is achieved by fixing crossed polarizer on the two faces of the device and applying electric field (Vpp=20 V at 80 Hz frequency) for two hours at room temperature for aligning the FLC material in the plane of the polymer coated substrate for getting the memory effect. The complete device is placed on the rotary table of an optical microscope and the sample so adjusted so as to get a dark state i.e. no light transmission through the sample. Next a field of 8 V DC was applied for 5 sec. Immediately after removing the dc bias the field of view turned bright i.e. the sample become transparent. The sample is now rotated by 45° which yields dark field of view. The observed memory effect in such a thick cell of DHFLC material is for less duration than thin. It starts decaying after 20 hours.

ADVANTAGES OF THE PRESENT INVENTION

The advantages of the present invention are:
1. Nonvolatile memory devices: This electrical bistable behavior is cyclable i.e. the previous state can be attained after the prolonged memory state. So this electrical bistable behavior can be used to store a virtual '0' and '1' [OFF and ON states], as represented by dark and bright states, for memory devices. Furthermore the bistability remains in either state even after the power is turned off making them ideal candidates for nonvolatile memory devices.
2. Computer applications: The promising application of this electrical bistability can be in personal computers, personal digital assistants, digital cameras etc.
3. Information technology: The bistable devices based on glycerol mixed DHFLC material would have a tremendous impact on the future of information technology and electronic industry. Moreover, the glycerol mixed DHFLC material memory system would have high potential for low cost, large area, high speed, high density memory needed for future advance computers and digital electronics.
4. The observed memory effect is most stable.
5. The proposed device is easy to fabricate, so mass production is very convenient.
6. Large scale commercially viable production can be easily carried out.
7. The rotational viscosity measurement is performed.
8. The polarization and response time measurement is performed.

We claim:

1. An optical memory device comprising:
    a sealed cell structure defining a space, said cell structure comprising a pair of transparent substrates having electrodes formed thereupon;
    and a mixture comprising deformed helix ferroelectric liquid crystal (DHFLC) and glycerol disposed within the space defined by said cell structure, the mixture comprises glycerol in the volume ratio of 3.3-10% of DHFLC.

2. The device as claimed in claim 1, wherein the transparent substrates are glass substrates.

3. The device as claimed in claim 1, wherein the electrodes are made of transparent conducting material selected from the group consisting of indium tin oxide, tin oxide, and zinc oxide.

4. The device as claimed in claim 1, wherein the transparent substrates are held at a predetermined distance from each other using spacer which is formed on a surface of at least one of the transparent substrate that faces the other substrate.

5. The device as claimed in claim 4, wherein the thickness of the spacer is in the range of 1 to 5 µm.

6. The device as claimed in claim 4, wherein the spacer is made of a film of photoresist prepared by photolithographic technique.

7. A method of preparing an optical memory device comprising the steps of:
    forming a cell structure comprising a pair of transparent substrates having electrodes deposited thereupon with a space defined between the transparent substrates;
    filling a mixture of deformed helix ferroelectric liquid crystal (DHFLC) and glycerol in the defined space, the glycerol being in the volume ratio of 3.3-10% of DHFLC; and
    sealing and baking the cell structure to obtain the optical memory device.

8. The method as claimed in claim 7, wherein the transparent substrates are glass substrates.

9. The method as claimed in claim 7, wherein the cell structure is formed by the steps of:
    cleaning and drying a pair of optically flat glass substrates;
    heating the dried glass substrates to a temperature in the range of 100°-250° C. for a period in the range of 30 min. to 60 min. in a vacuum chamber; and
    coating the heated glass substrates by depositing a thin film of indium tin oxide (ITO) having a thickness in the range of 1000 Å to 2000 Å to obtain coated glass substrates with sheet resistance in the range of 30 to 500Ω/� and optical transmission of at least 90%.

10. The method as claimed in claim 9, wherein upon obtaining the coated glass substrates, the method further comprises the steps of:
    cleaning thoroughly the said coated glass substrates in a detergent and acetone followed by rinsing in deionized water and drying in nitrogen gas and forming patterns to obtain an effective electrode area of at least 4.5 mm$^2$;
    cleaning again and drying the patterned glass substrates followed by spin coating of the patterned glass substrate with a polymer selected (nylon 6/6) in the thickness range of 200 to 400 Å; and
    baking the coated substrate at a temperature in the range of 100° C. to 120° C. for a period in the range of 30 min to 45 min followed by rubbing of the polymer coated surface in the desired direction of the surface of the coated glass substrate.

11. The method as claimed in claim 10, further comprising:
    coating one of the baked substrates with spin coating to get a spacer having thickness in the range of 1 to 5 µm; and
    assembling the coated glass substrates into a cell structure by maintaining a uniform cell gap and matching patterned ITO electrodes with small gap in the spacer photoresist deposited on one of the substrates.

12. The method as claimed in claim 11, wherein the spacer is made of a film of photoresist prepared by photolithographic technique.

13. The method as claimed in claim 9, wherein the coating used is selected from the group consisting of indium tin oxide, tin oxide, and zinc oxide.

14. The method as claimed in claim 9, wherein the solution for cleaning is selected from the group consisting of chromic acid, trichloroethylene, methanol.

15. The method as claimed in claim 10, wherein cleaning the patterned glass substrates comprises dipping the said substrates in silane solution.

16. The method as claimed in claim 7, wherein filling the mixture comprises filling the mixture in the space defined by the cell structure by capillary action done by heating at the temperature in the range of 80-100° C. followed by slow cooling at the rate of 5° C. per hour.

17. The method as claimed in claim 7, wherein sealing of the cell structure is carried out by thermal setting a thermoplastic or UV sealant.

18. The method as claimed in claim 7, wherein baking the sealed cell structure comprises baking the cell structure at a temperature in the range of 40 to 60° C. for the time period in the range of 1 to 2 hours.

* * * * *